United States Patent
Repper et al.

(10) Patent No.: US 7,255,100 B2
(45) Date of Patent: Aug. 14, 2007

(54) ELECTRONIC GAS COOKTOP CONTROL WITH SIMMER SYSTEM AND METHOD THEREOF

(75) Inventors: Pierre P. Repper, Chateauguay (CA);
Alan B. Shute, Stowe, VT (US);
Christa B. Shute, Stowe, VT (US);
Suzanne J. Shute, Stowe, VT (US);
Allen L. Olson, Craftsbury, VT (US);
Feng Zhou, Gloucester (CA)

(73) Assignee: CompuValve LLC, Stowe, VT (US)

( * ) Notice: Subject to any disclaimer, the term of this patent is extended or adjusted under 35 U.S.C. 154(b) by 591 days.

(21) Appl. No.: 09/884,828

(22) Filed: Jun. 18, 2001

(65) Prior Publication Data

US 2002/0045142 A1  Apr. 18, 2002
US 2005/0089809 A9  Apr. 28, 2005

Related U.S. Application Data

(63) Continuation of application No. PCT/US00/28624, filed on Oct. 16, 2000.

(60) Provisional application No. 60/159,885, filed on Oct. 18, 1999.

(51) Int. Cl.
*F16K 31/02* (2006.01)
*F23N 5/20* (2006.01)

(52) U.S. Cl. ............... 126/39 BA; 431/262; 431/78; 431/12; 126/39 E; 251/129.08; 251/129.05

(58) Field of Classification Search ........... 126/39 BA, 126/39 E; 431/12, 78, 262; 251/129.05, 251/129.08; 137/65, 66, 599.08
See application file for complete search history.

(56) References Cited

U.S. PATENT DOCUMENTS 3,469,590 A   9/1969   Barker (Continued)

FOREIGN PATENT DOCUMENTS

EP   000550340 A1 *   7/1993

(Continued)

*Primary Examiner*—Carl D. Price
(74) *Attorney, Agent, or Firm*—Theodore R. Touw; James Marc Leas

(57) ABSTRACT

An electronically activated gas cooktop control system, responsive to a touch-sensitive user interface, and capable of providing a predetermined range of cooking and simmer levels of BTU output, has two complementary heating modes of operation A first heating mode of operation is provided to produce a wide selection of simmer levels of BTU output, by electronically sequencing a solenoid-operated modulating gas valve "on" and "off", at a predetermined level of flame. A second cooking mode of operation is provided by electronically modulating the level of flame, through use of a pulse-width-modulation (PWM) output signal to produce a wide selection of cooking levels of BTU output. An igniter system capable of insuring proper ignition of gas without generating harmful electromagnetic interference is also provided.

78 Claims, 4 Drawing Sheets

U.S. PATENT DOCUMENTS

| | | | |
|---|---|---|---|
| 4,391,265 A * | 7/1983 | Chen | 126/39 E |
| 4,869,233 A * | 9/1989 | Stulen et al. | 126/374.1 |
| 4,997,161 A * | 3/1991 | Hutchison et al. | 251/129.08 |
| 5,241,463 A * | 8/1993 | Lee | 126/39 BA |
| 5,310,110 A * | 5/1994 | Akamatsu et al. | 236/20 A |
| 5,388,984 A * | 2/1995 | Meslif | 251/129.05 |
| 5,429,111 A | 7/1995 | Akamatsu | |
| 5,458,294 A | 10/1995 | Zachary | |
| 5,575,638 A * | 11/1996 | Witham et al. | 431/73 |
| 5,617,840 A | 4/1997 | Clifford | |
| 5,765,542 A * | 6/1998 | Fey et al. | 126/39 E |
| 5,813,394 A | 9/1998 | Clifford | |
| 5,892,201 A | 4/1999 | Croucher | |
| 5,924,857 A | 7/1999 | Frasnetti | |
| 5,938,425 A | 8/1999 | Damrath | |
| 5,947,370 A * | 9/1999 | Rona et al. | 236/20 A |
| 5,987,105 A * | 11/1999 | Jenkins et al. | 379/106.01 |
| 6,116,230 A * | 9/2000 | Clifford et al. | 126/39 BA |
| 6,133,554 A | 10/2000 | Clifford | |
| 6,310,611 B1 * | 10/2001 | Caldwell | 345/173 |

FOREIGN PATENT DOCUMENTS

| | | | |
|---|---|---|---|
| EP | 773409 | | 5/1997 |
| EP | 0800040 | * | 10/1997 |
| EP | 800040 A1 | * | 10/1997 |
| EP | 0802374 | * | 10/1997 |
| EP | 0964326 | * | 5/1999 |
| EP | 1058060 A1 | | 12/2000 |
| GB | 2249382 | * | 5/1992 |
| JP | 61-86516 | * | 5/1986 |
| JP | 61-276628 | * | 12/1986 |
| JP | 61-276628 A | * | 12/1986 |
| JP | 61-282720 A | * | 12/1986 |
| JP | 63-156927 | * | 6/1988 |
| JP | 05-280740 | * | 10/1993 |

* cited by examiner

ELECTRONIC GAS COOKTOP CONTROL WITH SIMMER SYSTEM AND METHOD THEREOF

This application is a continuation of PCT application PCT/US00/28624, filed Oct. 16, 2000, which claims benefit of U.S. Provisional Patent Application 60/159,885, filed Oct. 18, 1999.

TECHNICAL FIELD OF INVENTION

This invention relates to control of gas appliances in general and more specifically to an electronically actuated gas cooktop flame proportioning control with flame sequencing simmer system.

BACKGROUND ART

While easily achieved in electric cooktops, simmer temperatures have until now been complicated issues for gas cooking apparatus. Conventional gas cooktops are generally operated by using manually activated mechanical actuator knobs, with infinitely varying settings of the flow of gas by rotating associated gas proportional valves. Most often, adjustment of cooking level is achieved by comparing level indicators printed on the knob, to a fixed pointer printed on the cooktop surface, immediately surrounding the knob. With such knobs and associated infinite valves, it often becomes difficult for the user to precisely re-adjust the valve to a predetermined preferred level of BTU output and thus repeatability is rarely achieved. This effect is of an even greater concern in simmer mode of cooking where delicate food such as chocolate or sauces can be spoiled, if cooked at slightly higher temperatures than those recommended. Additionally, mechanical knobs are also usually susceptible to wear and tear and are often vulnerable to contaminants normally present in cooking areas, such as greases and moisture infiltration that generally find their way through open areas, necessary for the mechanical valve installation in the cooking surface. Spark igniters are typically used to ensure ignition of the gas and are generally activated upon rotation of the above-mentioned mechanical knobs. Most often, integrated sensors, such as flame detectors, are used to continuously monitor proper combustion of the gas. Such sensors typically provide feedback to the spark ignition module, to ensure re-ignition of the gas, should it fail to combust. However, very low flames have been proven hard to detect by such sensor types and are often a cause for spark igniters to unnecessarily generate discharges in response to false detection incidents. Spark igniters are also known, by those in the industry, to emit powerful electromagnetic interference (EMI) that often disturbs electronic equipment working in their vicinity. Microcontrollers used in electronic controls are also known to be highly susceptible to EMI emission, and hence generally need additional protection when used in conjunction with spark igniter modules in gas cooking apparatuses. Due to their large orifice size, burners that are capable of high BTU output are usually not suitable for simmer, one of the reasons being that smaller flames have the tendency to self-extinguish in such conditions. Therefore, some cooktops have been equipped with simmer burners, featuring smaller orifice diameters and capable of delivering stable low-to-medium BTU output. This has often had the effect of reducing the number of available burners capable of high BTU output on a given cooking surface. Various methods involving flame sequencing have been used to provide gas-cooking appliances with low temperature output to provide a simmer. Sequencing the flame on and off in a timely fashion provides for an elegant solution to achieve very low is BTU output from a burner also capable of high BTU output, but simmer systems of the prior art generally involve synchronized re-ignition of the gas following each flame on/off cycle, complicating even further the design of simmer controls in gas cooktops. Moreover, repeated re-ignitions of the gas during simmer mode often have the undesirable effect of continuously generating harmful electromagnetic interference. As mechanical valves are traditionally used to adjust the gas flow, additional electrically controlled "on/off" cycling solenoid valves are generally added to provide the "on/off" sequencing of the flame in simmer mode, contributing to higher system cost and reliability issues.

U.S. Pat. No. 4,376,626 to Rossi et al. (Device for the control of a sequential burner of a cooking apparatus) discloses a control device for at least one sequential burner of a cooking apparatus, comprising in combination: a geared-down synchronous motor and a drum which can be driven in rotation by this motor, an electric circuit associated with this drum, comprising at least one electric contact pressing upon the surface of the drum and at least one electrically conductive track arranged on the drum in such manner as to permit operation of the burner according to heating sequences which are variable as a function of the position of the electric contact on the drum, and means for adjusting the position of the contact in relation to the conductive track in order that the duration of the heating sequences of the burner may be varied progressively and continuously.

U.S. Pat. No. 5,575,638 to Witham et al. (Stove burner simmer control) discloses a burner control which provides a pulsed flame sequence in response to a user's selective manipulation of an actuator through a range of response. A microcontroller-based control module switches both a burner igniter control and an electric valve for gas supply to the burner in a predetermined time sequence depending upon the actuator position within the predetermined range. Preferably, one or more of a plurality of burners on a single cooking top are controlled for pulsed sequence operation, and a single actuator for each channel, preferably in a form of a rotary knob, provides a simple user interface for utilizing the pulsed flame sequence, preferably in a low gas flow or simmer cooking range.

U.S. Pat. No. 6,116,230 to Clifford et al. discloses a gas appliance comprising a burner, a conduit, a control circuit, and a valve. The control circuit is adapted to provide a pulse-width-modulated signal to the valve, whereby the valve provides a substantially linear flow rate of fuel from a fuel source to the burner. The gas appliance of Clifford et al. employs a spark igniter.

Thus, there is a need for an electronically controlled gas cooktop appliance capable of delivering true simmer temperatures from gas burners that are also capable of high BTU output. There is also a need for an electronic gas cooktop appliance that is capable of fine, precise, and repeatable control of heating levels, provided by a direct level-dialing control, thus providing the user with a more precise selection of available and controllable temperatures. There is also a need for a gas cooktop appliance capable of assuring flame re-ignition without generating harmful electromagnetic interference. There is equally a need for a gas cooktop flame-sequencing simmer system integrating gas-flow modulation and "on/off" sequencing ability into a single gas valve. Finally, there is a need for a gas cooktop appliance integrating an electronic user touch interface for burner activation and selection of temperature settings.

OBJECTS OF THE INVENTION

The present invention is intended to provide practical solutions to problems in the existing art, thus globally fulfilling the above-mentioned needs.

A major object of the invention is a gas cooktop appliance capable of delivering very low heat power while maintaining capability of delivering very high BTU output, in each available burner, and also capable of fine, precise and repeatable control over the entire span of cooking levels. Another object of the present invention is to provide a gas cooktop appliance with an innovative electronic control featuring a capacitive touch user interface, thus featuring a flat, smooth and sealed cooking surface. Such a capacitive touch interface facilitates the maintenance of surfaces that are generally prone to become dirty and that are also difficult to reach. A capacitive touch interface offers the additional benefit of eliminating the wear and tear associated with mechanical devices and also of preventing contaminants such as greases and moisture from reaching sensitive components internal to the cooktop apparatus.

Another object is an electronic control capable of handling simultaneously both modulation of the valve(s) for metering the gas flow delivered to the burners from medium to high BTU output, and sequencing of the flame "on" and "off" at a predetermined medium level of flame, to provide efficient simmer temperatures. An additional object is to provide electronic control of a gas cooktop featuring a direct-dial keyboard-entry system and a digital visual user interface such that repeatability and precise re-selection of predetermined cooking levels is achieved. Yet another object is to provide an initial gas ignition and a flame sequencing re-ignition system that does not need to be synchronized with the flame on/off cycling during simmer cook mode and that does not generate harmful electromagnetic interference.

SUMMARY OF THE INVENTION

The present invention relates to the field of gas cooking appliances in general and more specifically to a microcontroller-based electronic controller and simmer system for a gas cooktop appliance. In a preferred embodiment, the present invention is presented as a gas residential cooktop with controls, but it will be understood that the teachings of the present invention are also applicable to industrial and commercial gas cooktop appliances.

Among features provided by this invention are: a capacitive touch keyboard interface, an entirely electronic control system controlling the gas flow through modulating valves; an innovative modulating valve activated through a pulse-width-modulation (PWM) port, capable of infinitely controlling the flow of gas while also providing for an "off" position, the electrical modulating valve therefore eliminating the need for an additional in-line solenoid valve to sequence the flame "on" and "off" during simmer operation; and ceramic hot-surface igniter(s) controlled and monitored by the electronic control system, capable of constant gas re-ignition without generation of electromagnetic interference.

Natural or propane gas is selectively provided to each individual burner, through the use of electrically actuated modulating valves, thus eliminating the need for mechanical valves and actuator knobs protruding through the user console and facilitating the maintenance of such surfaces.

Ignition of the gas is monitored through temperature sensing, and ceramic hot-surface igniters are also monitored through current sensing. Safety features such as main in-line valve closure and de-energizing of the igniters are supported in the event that a fault condition occurs. Features such as visual and audible alarms are also generated, providing the user with positive indications of serious error conditions.

DETAILED DESCRIPTION OF PREFERRED EMBODIMENTS

Figure 1:
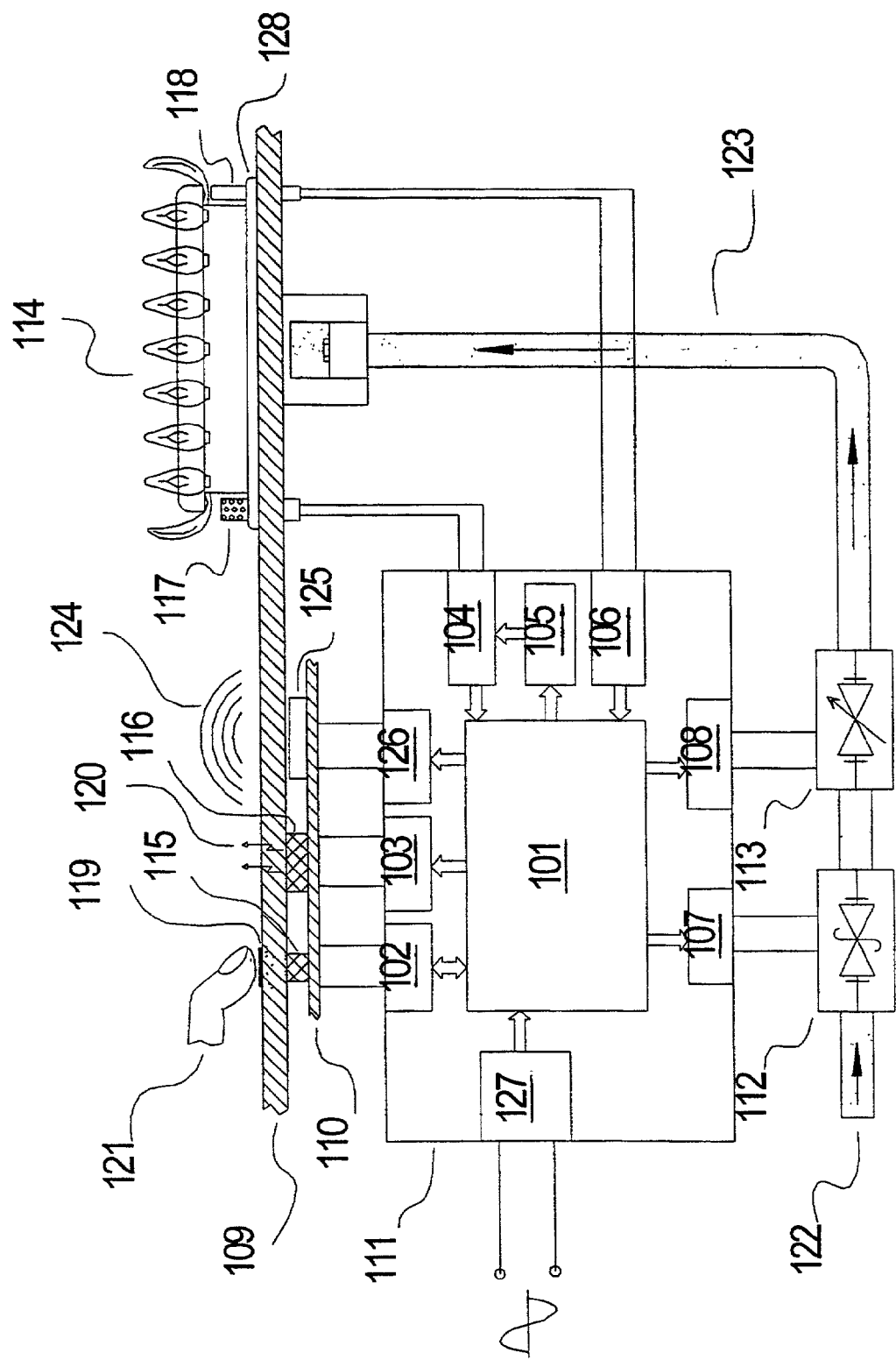
FIG. 1 is a basic block diagram of a cooktop system made in accordance with the invention.

FIG. 1 is a basic block diagram of a cooktop system made in accordance with this invention. The cooktop shown in FIG. 1 has one or more gas burner(s) 114 placed on a ceramic glass panel 109; one electronically controlled in-line safety gas valve 112; one or more electronically controlled in-line modulating valve(s) 113; a gas line conduit 123 to conduct gas from the main gas supply to the burner(s) under control through the in-line valves; a user interface panel 110 preferably placed in registry with a silk-screened portion of a ceramic glass panel 109; one or more temperature sensor(s) 118; one or more hot-surface igniter(s) 117; and a controller 111 operative to control each of the gas valves in accordance with the user's selection entered at the user interface, the apparatus being controlled by a suitably programmed microcontroller 101.

The user interface panel 110, placed in registry with a silk-screened portion of a ceramic glass panel 109, preferably further includes one or more visual indicator(s) 116, such as seven-segment LED displays, discrete LED displays, bar-graph LED displays, LCD displays, and vacuum fluorescent displays, for displaying information 120 concerning the status of the cooktop to the user; an audible annunciator 125 such as an external drive or built-in drive piezo-acoustic element, magnetic transducer or Mylar (a polyester film available from Dupont Tejin Films, Hopewell Va.) speaker, used to provide audible indication 124 that a touch key is selected and also to provide for an audible alarm whenever a system error is detected; and an array of capacitance sensitive keypads 115, each one having a capacitive field 119, produced, detected and analyzed by a capacitive-keyboard decoding interface module 102, and capable of electrically reacting to a human hand or finger 121, placed in proximity with any one capacitive field 119 associated with one of the capacitance sensitive keypads 115.

The microcontroller-based control 111 comprises an array of modules, dedicated to the driving and monitoring of the various elements of the system, controlled by the microcontroller 101.

The display elements of the visual indicators 116 are driven by a display-power-driver module 103 preferably comprising serial output shift registers (integrated circuits), multiple channels of source-driver integrated circuits, multiple channels of sink-driver integrated circuits, and may also include driver circuits using discrete transistors.

A power module 126 consisting of discrete transistor circuitry drives the audible interface 125. Power module may be unnecessary if the audible interface is made with one or more built-in drive acoustic annunciators.

A valve-power driving module includes a power relay or a trial module 107 for driving main safety valve 112 and a Darlington array integrated circuit or an array of discrete transistors 108 for driving the modulating valve(s) 113.

An igniter-power driving module 105 is also provided and includes a power relay or a trial module for driving one or more ceramic hot-surface igniter(s) 117. A current sensor module 104 is also provided for monitoring the current flowing through the hot-surface igniter(s) 117.

Appropriate amplification module 106 is provided to deliver reliable temperature sensor data, at the proper voltage span, to an analog-to-digital input port of microcontroller 101. Amplification may not be needed for some sensors, and thus module 106 may also be a simple voltage divider circuitry, e.g., if the temperature sensor used is a thermistor.

A sine-to-square-wave converter input module 127 is preferably included in the microcontroller-based control 111 to provide the microcontroller 101 with a reliable time base for proper timing of "on/off" flame sequencing periods, during simmer mode. The sine-to-square wave converter input module 127 may consist of a diode rectifying input circuitry, tapping a portion of the conventional AC supply voltage and feeding a transistor based circuit. That circuit, connected to a pull-up resistor, provides as an output a square wave representative of the 50 Hz or 60 Hz signal carried by the AC voltage supply line.

Additionally, the microcontroller-based control 111 preferably includes a capacitive-keyboard decoding interface module 102 with a serial or parallel communication interface, capable of detecting and analyzing a user touch condition. The capacitive-keyboard decoding module preferably includes: a capacitive matrix decoder integrated circuit with a serial or parallel communication interface, a portion of the ceramic glass panel 109 (preferably silk-screened) used to provide for a user touch interface, and an array of capacitive sensing keypads 115 placed in registry with the user touch interface portion of the ceramic glass panel 109. Key sensitivity may be made individually trimmable for adaptation to key size, key shape, and key location on the user interface keyboard. Capacitive sensing for the keyboard interface may be done as described in U.S. Pat. No. 5,730,165 to Philipp, the entire disclosure of which is hereby incorporated by reference. In U.S. Pat. No. 5,730,165, a capacitive field sensor employs a single coupling plate to detect a change in capacitance to ground. The apparatus comprises a circuit for charging a sensing electrode and a switching element acting to remove charge from the sensing electrode and to transfer it to a charge detection circuit.

A suitable capacitive-keyboard decoding interface 102 is the model QM1, available from Quantum Research Group Ltd. of Southampton, England and Pittsburgh, Pa., or preferably the models QT60320 and QT 60321 Matrix Scan IC's available from that company. The QT60320 family of Matrix Scan IC's is a family of capacitive-keyboard decoding interfaces, based on the Philipp invention mentioned above, utilizing dual coupling capacitive plate sensors, disposed in a key matrix configuration.

The microcontroller-based control 11 also preferably includes a microcontroller integrated circuit 101 having integrated features, as per the following list:

a) a bi-directional serial communication port for interfacing with a capacitive-keyboard decoder integrated circuit;

b) a serial peripheral interface port for interfacing with display interface circuitry;

c) a pulse-width-modulation (PWM) output port for controlling gas modulating valves;

d) an input port for 60 Hz signal detection;

e) an output port for controlling a main gas solenoid safety valve;

f) an output port for interfacing with an audible annunciator;

g) an analog-to-digital converter input port for temperature monitoring;

h) an output port for controlling a gas igniter module; and i) an analog-to-digital converter input port for monitoring gas igniter current.

Those skilled in the art will recognize that multiple ports of any of the types listed may be provided.

The valve portion of the system preferably includes an in-line gas valve assembly having a single main in-line solenoid safety valve 112, commonly found in the industry and an in-line modulating valve 113 for each burner. One suitable modulating valve is disclosed in U.S. Pat. No. 5,458,294 to Zachary et al., in which a variable orifice solenoid has a plurality of positions, and the positions are controlled by the application of a voltage signal to the modulating valve. The entire disclosure of U.S. Pat. No. 5,458,294 to Zachary et al. is incorporated herein by reference, as is the entire disclosure of U.S. Pat. No. 6,116,230 to Clifford et al., mentioned above.

U.S. Pat. No. 5,458,294 discloses an apparatus for accurately controlling gas fuel flow to a combustion device to control gas flow to a burner of the combustion device. A variable orifice solenoid-operated valve serves as a control element. The valve includes a poppet having a fixed control surface at an end received in an insert element having a variable control surface. The poppet has a plurality of positions within the insert element, including a full open position and a full closed position. Maximum fuel flow is measured in the full open position and minimum fuel flow is measured in the full closed position. Intermediate partially open positions are adjustable by a signal of an electronic controller connected to the solenoid valve operating as a function of actual and desired temperature of the combustion device. If desired, the fixed control surface can contact the variable control surface at some point as the fixed control surface moves into the insert, to completely seal the valve and shut off the flow of gas to the burner means.

The flame ignition portion of the system preferably includes a resistive hot-surface igniter 117, preferably fixed to the burner base 128, capable of producing a temperature of 1350° C. in a time-to-design-temperature equal to or less than 3 seconds. U.S. Pat. No. 5,892,201 to Croucher et al., discloses a ceramic igniter, comprising: (a) a pair of electrically conductive portions, each portion having a first end, (b) a hot zone disposed between and in electrical connection with each of the first ends of the electrically conductive portions, the hot zone having an electrical path length of less than 0.5 cm, and (c) an electrically non-conductive heat sink material contacting the hot zone. The entire disclosure of U.S. Pat. No. 5,892,201 to Croucher et al. is incorporated herein by reference. One suitable resistive ceramic hot-surface igniter is the Norton Igniter model No. M-401 manufactured by Saint-Gobain Industrial Ceramics Inc. of Milford, N.H.

Additionally, the invention provides for one or more temperature sensor(s) 118, each one fixed to the burner base 128 and directed at the flame area of the burner to detect a flame, thus monitoring proper ignition of the gas delivered to the burner 114 by the modulating valve(s) 113. The temperature sensor may be of any suitable type, such as: thermistors, thermocouples, or infrared temperature sensors.

Operation

A continuous flame modulation mode of operation, described below, is used for the portion of the total span of gas output levels that can be safely modulated by the modulating valve, where the flame is continuously present and not sequenced "on" and "off" by the controller. This continuous flame modulation mode is associated with cooking levels ranging from medium-low to high BTU output. Furthermore, medium-low level of flame is defined here as being the lowest level of flame that can be safely maintained without self-extinguishing, can be safely ignited by a ceramic hot-surface igniter, and can be easily sensed by the flame detector, for any particular burner orifice size.

In continuous-flame-modulation mode of operation the microcontroller 101 first sends a signal to the power-driving portion 107 of the controller, driving the safety valve 112 "on" to permit the gas entering the system 122 to reach the in-line modulating valve(s) 113, then the microcontroller 101 sends a pulse-width-modulation signal to the power-driving portion 108 of the controller 111 driving the modulating valve 113, to proportionally modulate the valve opening size to the desired gas flow level, as selected by the user and, thus, to permit the gas to reach the burner. Hence, this mode of operation adjusts the flame height to any desired level of BTU output ranging from medium-low to high BTU output. Furthermore, in this particular mode of operation, the hot-surface igniter 117 is powered only during the first phase of the continuous-flame modulation mode of operation. Ignition is provided and maintained from the time that the gas is permitted to reach the burner, until a flame is detected by the appropriate temperature sensor 118 associated with the controlled burner. Ignition process can also be aborted if one of the following error conditions occurs: no hot-surface igniter current is sensed, and/or flame is not detected for a predetermined period of time. In any of these error condition cases, the controller 111 automatically turns off the safety valve 112, the hot-surface igniter 117, and the modulating valve 113 corresponding to the faulty burner. Then, visual and audible signals are generated to alert the user of the faulty condition.

Simmer mode of operation is defined here as being the mode of operation used for the lowest portion of the total span of BTU output levels. In simmer mode of operation, the microcontroller 101 first sends a signal to the power-driving portion 107 of the controller, driving the safety valve 112 "on", to permit the gas entering the system 122 to reach the in-line modulating valve(s) 113. Then, the microcontroller 101 sends a predetermined pulse-width-modulation signal to the power-driving portion 108 of the controller 111 driving the modulating valve 113, to proportionally modulate the valve opening size to a predetermined level of gas flow, and, thus, to permit the gas to reach the burner. In simmer mode of operation, the pulse-width-modulation (PWM) output level is set to provide a predetermined medium-low height level of flame that can safely be maintained without self-extinguishing, can safely be ignited by the ceramic hot-surface igniter, and can easily be sensed by the flame detector, for any particular burner orifice size. In that particular mode of operation the pulse-width-modulation output, which drives the modulating valve associated with the burner working in simmer mode, is continuously being sequenced "on" and "off" by the microcontroller 101. A time-based sequencer, ruled by appropriate software program and 60 Hz detection module 127, is activated, toggling the PWM output driving the modulating valve, and thus turning the flame "on" and "off" in a timely fashion. During the "off" portion of the sequencing, while no PWM signal is provided to the modulating valve, the valve reverts to its "off" position, sealing the opening and thus preventing the gas from reaching the gas burner under simmer mode of operation. During the "on" time portion of the sequencing, the PWM output is set to the medium-low level of BTU output, providing the safest low level of flame that can be ignited, maintained, and sensed by the temperature sensor. The "on" and "off" periods are produced to correspond to a desired simmer level as selected by the user. As an example of this, for a particular output level, as selected by the user; "on" time, when the flame is present, can be equal to 1 second, and "off" time, when the flame is not present, can be equal to 7 seconds, to produce a 1 over 8 or 1:8 ratio of BTU output in relation to an hypothetical constant flame produced at the same predetermined flame height level. Additionally, during that particular mode of operation, the hot-surface igniter 117 is continuously powered by the igniter power module 105, and constantly monitored by the igniter-current sensor module 104 to provide for an instantaneous ignition process, bypassing the time-to-design-temperature period. Furthermore, the temperature sensor output is read during each "on" portion of the flame sequencing activities. Ignition is thus provided and maintained until the user selects a burner powering level other than those provided within the span of simmer mode of operation, and can also be aborted if one of the following error condition occurs: no hot-surface igniter current is sensed and/or flame is not detected during the "on" periods of the sequencing cycles. In any of these error condition cases, the controller 111 automatically turns off the safety valve 112, the hot-surface igniter 117, and the modulation valve 113. Then, visual and audible signals are generated to alert the user of the faulty condition.

Total span of BTU output can range from very low to very high and have an infinite number of steps from which many can operate in simmer mode of operation and many others in the continuous flame modulation mode of operation. For example, a particular control could arbitrarily offer 44 levels of BTU output, from which the lowest fourteen levels could be operating in a simmer mode of operation and the remaining 30 levels could be modulated in a continuous flame modulation mode of operation. The above-mentioned example is given here only as one possible embodiment of the present invention and does not intend to constitute a limitation to the present invention. One of ordinary skill in the art would readily perceive that the total number of possible cooking-level steps, as well as the portion of these steps predetermined to work either in the simmer mode or in the continuous flame modulation mode of operation, are readily defined by appropriate software programming alone. Control software programming is described next.

Control Software

Figure 3A:
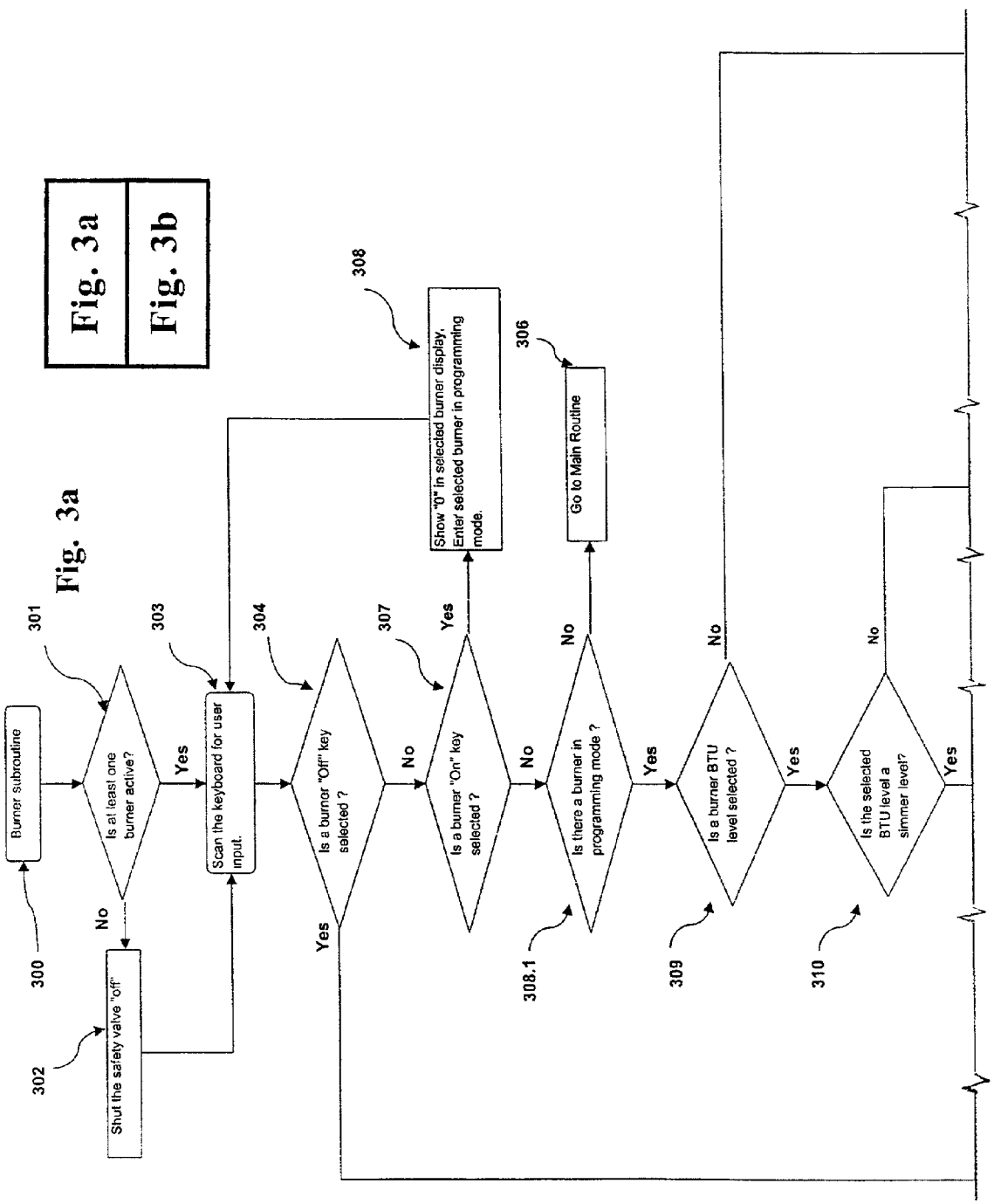
FIGS. 3a and 3b together show a flowchart of control software for a preferred embodiment of the invention.
Figure 3B:
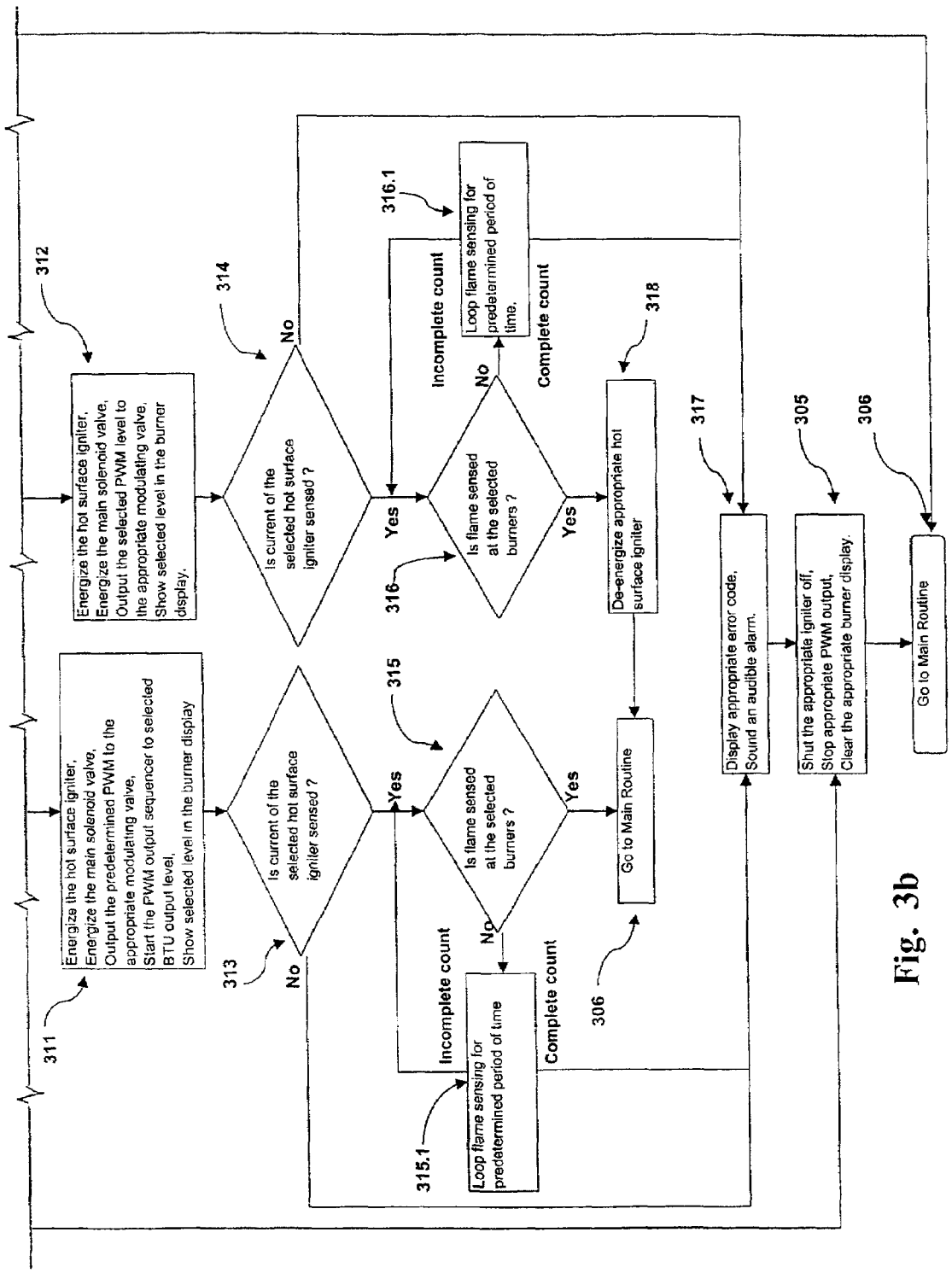

FIGS. 3a and 3b together show a flowchart of control software for a preferred embodiment of the invention, using conventional flowchart symbols. Table I below shows the steps used in the control software illustrated in FIGS. 3a and 3b together.

TABLE I

Control software process steps

| Step | Function performed |
|---|---|
| 300 | Start burner subroutine |
| 301 | Test: Is at least one burner active? |
| 302 | Shut safety valve OFF |
| 303 | Scan keyboard for user input |
| 304 | Test: Is a burner OFF key selected? |
| 305 | Shut igniter OFF; stop PWM output; clear burner display |
| 306 | Go to main routine |

TABLE I-continued

Control software process steps

| Step | Function performed |
|---|---|
| 307 | Test: Is a burner ON key selected? |
| 308 | Show "0" in selected burner display; enter selected burner program mode |
| 308.1 | Test: Is there a burner in program mode? |
| 309 | Test: Is a burner BTU level selected? |
| 310 | Is the selected BTU level a simmer level? |
| 311 | Energize the hot surface igniter, etc. (Simmer mode - see description) |
| 312 | Energize the hot surface igniter, etc. (Continuous flame modulation mode - see description) |
| 313 | Test: Is current of the selected hot surface igniter sensed? |
| 314 | Test: Is current of the selected hot surface igniter sensed? |
| 315 | Test: Is flame sensed at the selected burners? |
| 315.1 | Loop flame sensing for predetermined period of time |
| 316 | Test: Is flame sensed at the selected burners? |
| 316.1 | Loop flame sensing for predetermined period of time |
| 317 | Display appropriate error code; sound audible alarm |
| 318 | De-energize appropriate hot surface igniter |

It can be seen in FIGS. 3a and 3b that if no burner is activated 301, the safety valve of the gas system is turned "off" 302. As illustrated in the flow chart of FIGS. 3a and 3b, the keyboard is periodically scanned for user input 303 and, depending on the type of key detected as touched by the capacitive-keyboard-decoding interface, a specific number of steps are consequentially performed by the microcontroller as dictated by the control software. For instance, if a burner "Off" key is touched 304, the microcontroller will then shut the appropriate igniter "off", stop the PWM output to the appropriate modulating valve, clear the appropriate burner display 305 and finally revert to the main routine of the control software 306. If a burner "On" key is detected 307, the software will place the appropriate burner in programming mode and notify the user of that condition using of the appropriate display 308. If a burner level key is selected 309, the software verifies 310, through the use of a software table, whether the selected BTU level belongs to the class of BTU output dedicated to simmer mode or to continuous-flame-modulation mode of operation, and chooses the appropriate mode accordingly. Although the two modes of operation adopt different behaviors 311 and 312, in both cases current flowing through the igniters 313 and 314 and also flame ignition 315 and 316 are monitored for proper operation.

If no current flows through the igniters while activated and/or no flame is sensed while gas is conducted to the burner under control, then visual and audible alarms are generated 317, and the faulty burner is deactivated by stopping appropriate PWM output, shutting off the appropriate igniter and clearing the appropriate burner display 305.

In simmer mode of operation shown by the series of actions identified by reference numeral 311, i.e., when a simmer level of BTU output is selected by the user, the microcontroller energizes the hot surface igniter, energizes the main solenoid valve, outputs a predetermined PWM level to the appropriate modulating valve, sets the PWM output sequencer to selected BTU output level, shows the selected burner level in the burner display and leaves the igniter continuously "on" during the entire simmer operation.

In continuous-flame-modulation mode of operation, shown by the series of actions identified by reference numeral 312, i.e., when a level of BTU output other than simmer level is selected by the user, the microcontroller then energizes the hot surface igniter, energizes the main solenoid valve, outputs the selected PWM level to the appropriate modulating valve, shows the selected burner level in the burner display and further de-energizes the hot surface igniter once the ignition of the flame is achieved 318.

Use of the Invention

Figure 2:
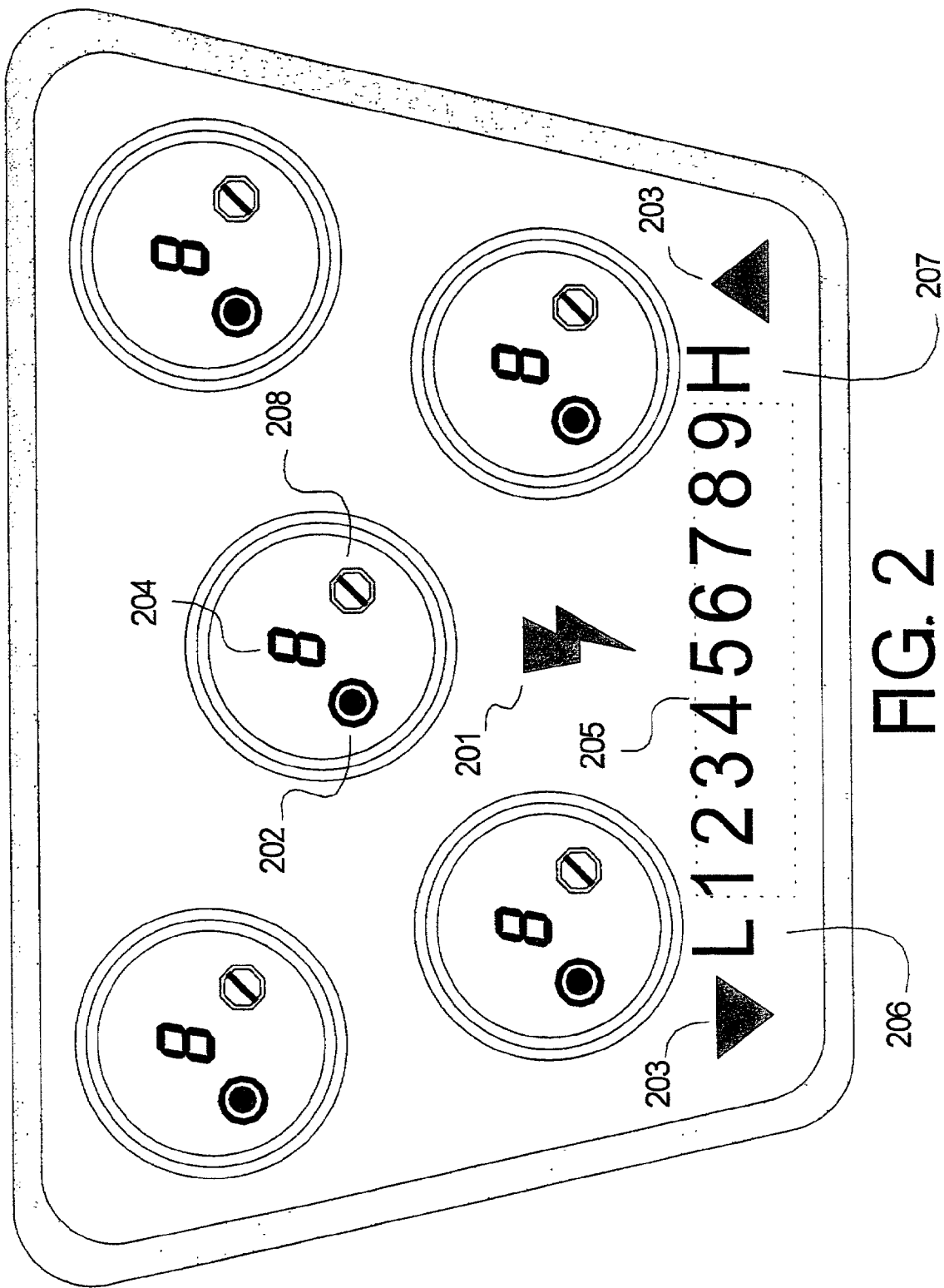
FIG. 2 is an example of one of many possible user interfaces, to be used in conjunction with the present invention.

To use the invention, a user touches desired control keys on the cooktop keyboard similar to the one illustrated in FIG. 2. For example, the user may touch a POWER key 201 to energize the keyboard and enable the controller. The user may then touch the ON key 202 of a particular burner, corresponding to a particular position on the keyboard layout, to turn a specific gas burner on. The user may touch arrow keys 203 to raise or lower the gas power level for the selected burner and get a visual indication of the newly selected power level, through the visual interface 204. If a "slider" control is provided on the keyboard layout, the user can move a finger along the slider control to control the heat level of a particular burner. The user may directly touch any one of the POWER level number 205 or "L" 206 for low or "H" 207 for high. The user may touch the "off" key 208 of a particular burner to turn it off or touch the POWER key 201 to turn every active burner off. The particular keyboard layout embodiment depicted in FIG. 2 is meant to be representative of a type of touch-sensitive keyboard layout suitable for a cooktop. Preferably, the keyboard layout should, by the use of numerals, symbols, and other indicia, convey to the user the various control functions available, in a manner that is as clear and intuitive as possible. The person of ordinary skill in the art of appliances will recognize that many variations of keyboard layouts with correspondingly programmed functions may be made that are suitable for various uses of gas or hybrid gas/electric cooktops.

INDUSTRIAL APPLICABILITY

The invention is useful in domestic and commercial cooking, providing an electronically controlled gas cooktop with multiple heating modes, including precisely controlled simmering and safety features.

Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. One skilled in the art can easily ascertain the essential characteristics of this invention, and without departing from the spirit and scope thereof, can make various changes and modifications of the invention to adapt it to various usages and conditions.

What is claimed is:

1. A cooktop, comprising a gas burner, a dual function gas valve, a user interface, an electronic controller, an igniter, and a flame sensor, wherein said electronic controller is connected to said dual function gas valve to control gas flow to said gas burner, wherein said user interface is for user entry of burner heating level for said gas burner, wherein said electronic controller is operative to control said dual function gas valve in accordance with said user entry, wherein said flame sensor is connected and placed to monitor for presence of flames at said gas burner, wherein said dual function gas valve includes a first mechanism to operate in a first electronically controlled mode and a second mechanism to operate in a second electronically controlled mode, said first mode providing a continuous flame at said gas burner modulated to a predetermined lower first heating level or to a predetermined higher second heating level, and said second mode providing intermittent flame at said gas burner for producing heating levels less than said lower first heating level for simmering operation, said igniter connected to ensure reignition of the gas delivered to said gas burner when said dual function gas valve is operating in said second electronically controlled mode.

2. A cooktop as in claim 1, wherein said user interface comprises one or more touch-sensitive pads.

3. A cooktop as in claim 2, wherein said user interface further comprises a visual interface including a display selected from the list consisting of:
- a) seven-segment LED displays;
- b) discrete LED displays;
- c) bar-graph LED displays;
- d) LCD displays;
- e) vacuum fluorescent displays; and
- f) field-emission displays.

4. A cooktop as in claim 2, wherein said user interface further comprises an audible interface including an annunciator selected from the list consisting of:
- a) an external drive piezo-acoustic element;
- b) a built-in drive piezo-acoustic element;
- c) an external drive magnetic transducer;
- d) a built-in drive magnetic transducer;
- e) an external drive speaker; and
- f) a built-in drive speaker.

5. A cooktop as in claim 1, further comprising a plurality of gas burners, one said dual function gas valve for each said gas burner, wherein each of said gas valves includes a proportionally controlled solenoid-operated modulating gas valve, wherein no gas flows in its fully closed position.

6. A cooktop as in claim 5, wherein each of said dual function gas valves comprises a proportionally controlled solenoid-operated modulating gas valve wherein maximum gas flows in its fully open position.

7. A cooktop as in claim 6, wherein each of said dual function gas valves is also capable of providing any intermediate controlled position.

8. A cooktop as in claim 1, wherein said user interface comprises a multiplicity of touch-sensitive pads operable to select burner heating levels in a predetermined set of user-selectable steps.

9. A cooktop as in claim 8, wherein a lowest portion of said user-selectable steps corresponds to a flame "on/off" sequencing mode of flow settings of said dual function gas valve.

10. A cooktop as in claim 8, wherein a highest portion of said user-selectable steps corresponds to a continuous flame modulation mode of flow settings of said dual function gas valve.

11. A cooktop as in claim 8, wherein each of said user-selectable steps corresponds to one of a multiplicity of flow settings of said dual function gas valve in a predetermined range.

12. A cooktop as in claim 1, wherein said igniter comprises a resistive hot-surface igniter.

13. A cooktop, comprising:
- a) a gas burner;
- b) a dual function gas valve connected to control gas flow to said gas burner wherein said dual function gas valve includes a first mechanism to operate in a first electronically controlled mode and a second mechanism to operate in a second electronically controlled mode, said first mode providing a continuous flame at said gas burner modulated to a predetermined lower first heating level or to a higher second heating level, and said second mode providing intermittent flame at said gas burner for producing heating levels less than said lower first heating level for simmering operation;
- c) a user interface for user entry of burner heating level for said gas burner, wherein said user interface comprises a multiplicity of touch-sensitive pads operable to select burner heating levels in a predetermined set of user-selectable steps and wherein a lowest portion of burner heating levels corresponds to a flame "on/off" sequencing mode of flow settings of said dual function gas valve;
- d) a controller operative to control said dual function gas valve in accordance with said user entry;
- e) an igniter connected to ensure reignition of the gas delivered to said gas burner when said dual function gas valve is operating in said second electronically controlled mode; and
- f) a flame sensor connected and placed to monitor the presence of flames at said gas burner.

14. A cooktop as in claim 13, wherein said gas valve comprises a proportionally controlled solenoid-operated modulating gas valve wherein no gas flows in its fully closed position.

15. A cooktop as in claim 13, wherein said gas valve comprises a proportionally controlled solenoid-operated modulating gas, valve wherein maximum gas flows in its fully open position.

16. A cooktop as in either of claims 14 and 15, wherein said gas valve comprises a proportionally controlled solenoid-operated modulating gas valve is also capable of providing any intermediate controlled position.

17. A cooktop as in claim 13, wherein a highest portion of said user-selectable steps corresponds to a continuous flame modulation mode of flow settings of said dual function gas valve.

18. A cooktop as in claim 13, wherein each of said user-selectable steps corresponds to one of a multiplicity of flow settings of said dual function gas valve in a predetermined range.

19. A cooktop as in claim 13, wherein said user interface further comprises a visual interface including a display selected from the list consisting of:
- a) seven-segment LED displays;
- b) discrete LED displays;
- c) bar-graph LED displays;
- d) LCD displays;
- e) vacuum fluorescent displays; and
- f) field-emission displays.

20. A cooktop as in claim 13, wherein said user interface further comprises an audible interface including an annunciator selected from the list consisting of:
- a) an external drive piezo-acoustic element;
- b) a built-in drive piezo-acoustic element;
- c) an external drive magnetic transducer;
- d) a built-in drive magnetic transducer;
- e) an external drive speaker; and
- f) a built-in drive speaker.

21. A cooktop as in claim 13, wherein said igniter comprises a resistive hot-surface igniter.

22. A cooktop as in claim 13, further comprising a main in-line solenoid safety valve.

23. A heating device, comprising:
a gas burner;
a single dual function valve including both a first electronically controlled mechanism and a second electronically controlled mechanism within said single dual function valve, said single dual function valve connected to provide gas to said gas burner;

an electronic controller for electronically controlling said first electronically controlled mechanism and said second electronically controlled mechanism;

said first electronically controlled mechanism capable of providing at least two different on-levels of continuous gas flow to said gas burner; and said second electronically controlled mechanism capable of stopping and starting flow of gas to said gas burner, wherein combination of said first electronically controlled mechanism and said second electronically controlled mechanism provides capability to achieve a lower temperature than is achievable with just continuous flow of gas from said first electronically controlled mechanism.

24. A heating device as recited in claim 23, wherein said first electronically controlled mechanism is capable of providing 30 different on-levels of gas flow.

25. A heating device as recited in claim 23, wherein said gas burner is capable of providing a flame, wherein said electronic controller is capable of controlling said second mechanism far sequencing the flame on and off at a predetermined level of flame.

26. A heating device as recited in claim 25, wherein said controller comprises a microcontroller, wherein sequencing the flame on and off is controlled by said microcontroller.

27. A heating device as recited in claim 26, wherein said microcontroller further comprises a pulse width modulation output port and an A/D converter.

28. A heating device as recited in claim 25, wherein sequencing the flame on and off is controlled by time.

29. A heating device as recited in claim 25, wherein sequencing the flame on and off is accomplished with the on level set to a predetermined medium level of flame or with the on level set to a medium-low level of BTU output.

30. A heating device as recited in claim 25, wherein sequencing the flame on and off is accomplished with gas flow on and off for time periods to correspond to a desired simmer level.

31. A heating device as recited in claim 23, wherein said controller uses pulse-width-modulation for controlling said first mechanism.

32. A heating device as recited in claim 23, further comprising an igniter, wherein said igniter assures re-ignition of said gas when said second mechanism is used.

33. A heating device as recited in claim 32, wherein said igniter does not need to be synchronized with on/off cycling of said flow of gas during simmer made.

34. A heating device as recited in claim 33, wherein said igniter is continuously powered when said second mechanism is used.

35. A heating device as recited in claim 32, wherein said igniter comprises a resistive hot-surface igniter.

36. A heating device as recited in claim 35, wherein said igniter comprises a ceramic hot-surface igniter capable of constant re-ignition.

37. A heating device as recited in claim 23, further comprising a main in-line solenoid safety valve.

38. A heating device as recited in claim 23, further comprising a plurality of gas burners and a plurality of said dual function valves, wherein each of said plurality of gas burners has one of said plurality of dual function valves connected to provide gas.

39. A heating device as recited in claim 23, wherein said first mechanism comprises a variable orifice solenoid that has a plurality of positions controlled by application of a voltage signal.

40. A heating device as recited in claim 23, further comprising an igniter for igniting gas when said first electronically controlled mechanism provides flow of gas.

41. A heating device as recited in claim 40, wherein said igniter is a hot-surface igniter.

42. A heating device as recited in claim 40, further comprising an igniter for igniting gas when said fist electronically controlled mechanism and said second electronically controlled mechanism provides flow of gas.

43. A beating device as recited in claim 42, wherein said igniter is set to be on continuously when said second electronically controlled mechanism is being used to stop and start flow of gas to said gas burner.

44. A heating device as recited in claim 40, further comprising a circuit to monitor ignition, said circuit including a sensor for sensing at least one from the group consisting of flame and current flowing in said igniter.

45. A heating device as recited in claim 23, further comprising a user interface.

46. A heating device as recited in claim 45, wherein said user interface comprises a dial control.

47. A heating device as recited in claim 45, wherein said user interface comprises touch switches.

48. A heating device as recited in claim 47, wherein said touch switches comprises a touch pad.

49. A heating device as recited in claim 45, wherein said user interface comprises a capacitive touch keyboard.

50. A heating device as recited in claim 45, wherein said user interface comprises a power key, an on key, power level control keys, and an off key.

51. A heating device as recited in claim 23, further comprising a digital visual display of cooking level of each said gas burner.

52. A heating device as recited in claim 51, wherein said digital visual display comprises an LED, LCD, or a vacuum fluorescent display.

53. A heating device as recited in claim 23, further comprising a burner base and a flame sensor fixed to said burner base.

54. A heating device as recited in claim 53, further comprising an igniter and a circuit to detect current flowing in said igniter, wherein if no current flows in said igniter during an ignition period or no flame is sensed then visual and audible alarms are generated.

55. A heating device as recited in claim 23, further comprising a main in-line valve for closing off flow if a fault condition occurs.

56. A heating device as recited in claim 55, further comprising an igniter, wherein said igniter is de-energized if a fault condition occurs.

57. A device for controlling flow of a fluid, comprising:
a dual function valve including both a first electronically controlled mechanism and a second electronically controlled mechanism;
an electronic controller for electronically controlling said first electronically controlled mechanism and said second electronically controlled mechanism;
said first electronically controlled mechanism capable of providing at least two different on-levels of continuous fluid flow; and
said second electronically controlled mechanism capable of continuously being sequenced between allowing fluid flow on and sealed off to prevent fluid flow thereby providing an intermittent flow of fluid, wherein said second electronically controlled mechanism is set to allow flow for a fraction of time and is otherwise set to be sealed off, wherein overall flow is proportional to said fraction.

58. A device as recited in claim 57, wherein said fluid comprises gas.

59. A device as recited in claim 58, wherein said first electronically controlled mechanism is capable of providing any intermediate level of gas flow.

60. A device as recited in claim 58, wherein said first electronically controlled mechanism is capable of providing 30 different on-levels of gas flow.

61. A device as recited in claim 58, wherein said electronic controller is capable of controlling said second mechanism for sequencing flow on and off at a predetermined level.

62. A device as recited in claim 61, wherein said controller comprises a microcontroller, wherein sequencing fluid flow on and off is controlled by said microcontroller.

63. A device as recited in claim 62, wherein said microcontroller further comprises a pulse width modulation output port and an A/D converter.

64. A device as recited in claim 61, wherein sequencing the flow on and off is controlled by time.

65. A device as recited in claim 61, wherein sequencing the flow on and off is accomplished with the on level set to a medium-low level.

66. A device as recited in claim 61, wherein sequencing the flow on and off is accomplished with gas flow on for 1 second and off for 8 seconds.

67. A device as recited in claim 57, further comprising a digital visual display of flow.

68. A device as recited in claim 67, wherein said digital visual display comprises an LED, LCD, or a vacuum fluorescent display.

69. A device as recited in claim 57, wherein said controller uses pulse-width-modulation for controlling said first mechanism.

70. A device as recited in claim 57, further comprising a main in-line solenoid safety valve.

71. A device as recited in claim 57, wherein said first mechanism comprises a variable orifice solenoid that has a plurality of positions controlled by application of a voltage signal.

72. A device as recited in claim 57, wherein said fluid comprises gas and wherein a single gas valve includes both said first electronically controlled mechanism and said second electronically controlled mechanism.

73. A device as recited in claim 57, further comprising a user interface.

74. A device as recited in claim 73, wherein said user interface comprises a dial control.

75. A device as recited in claim 73, wherein said user interface comprises touch switches.

76. A device as recited in claim 75, wherein said touch switches comprises a touch pad.

77. A device as recited in claim 73, wherein said user interface comprises a capacitive touch keyboard.

78. A device as recited in claim 73, wherein said user interface comprises a power key, an on key, power level control keys, and an off key.

* * * * *